United States Patent

Bundschuh et al.

Patent Number: 5,504,422
Date of Patent: Apr. 2, 1996

[54] POLARITY TESTING PROCESS AND DEVICE FOR ELECTROLYTIC CAPACITORS

[75] Inventors: Goetz Bundschuh, Gerlingen; Axel Sterzl, Reutlingen, both of Germany

[73] Assignee: Robert Bosch GmbH, Stuttgart, Germany

[21] Appl. No.: 244,100

[22] PCT Filed: Nov. 6, 1992

[86] PCT No.: PCT/DE92/00923

§ 371 Date: May 16, 1994

§ 102(e) Date: May 16, 1994

[87] PCT Pub. No.: WO93/10464

PCT Pub. Date: May 27, 1993

[30] Foreign Application Priority Data

Nov. 16, 1991 [DE] Germany .................. 41 37 758.3

[51] Int. Cl.$^6$ .................................................. G01R 1/30
[52] U.S. Cl. .............................................. 324/133; 324/658
[58] Field of Search .................................. 324/548, 658, 324/133; 209/574

[56] References Cited

U.S. PATENT DOCUMENTS

| | | | |
|---|---|---|---|
| 4,447,785 | 5/1984 | Wright | 320/48 |
| 4,745,359 | 5/1988 | Leitz | 324/133 |
| 4,748,401 | 5/1988 | Aldinger | 324/548 |
| 4,779,040 | 10/1988 | Aldinger | 324/61 |
| 5,343,135 | 8/1994 | Mathieson | 320/48 |

FOREIGN PATENT DOCUMENTS

| | | | |
|---|---|---|---|
| 0185255 | 6/1986 | European Pat. Off. | |
| 0258516 | 3/1988 | European Pat. Off. | |
| 3213110 | 10/1983 | Germany | |
| 3033663 | 2/1991 | Japan | |
| 0146876 | 6/1991 | Japan | 324/133 |
| 403273169 | 12/1991 | Japan | 324/133 |
| 404098161 | 3/1992 | Japan | 324/548 |
| 405209919 | 8/1993 | Japan | 324/548 |
| 406094765 | 4/1994 | Japan | 324/548 |
| 0203966 | 11/1994 | Japan | 324/133 |
| 1638664 | 3/1991 | U.S.S.R. | 324/548 |

OTHER PUBLICATIONS

IBM Technical Disclosure Bulletin vol. 26 No. 2 Jul. 1983 Reverse Capacitor Tester Roop et al.

*Primary Examiner*—Maura K. Regan
*Attorney, Agent, or Firm*—Kenyon & Kenyon

[57] ABSTRACT

A method and a device for testing the polarity of aluminum electrolytic capacitors having a metallic housing and at least two terminal connections of different polarities. An a.c. test voltage is applied between the metallic housing and the two terminals of an electrolytic capacitor whose polarity is being tested, and the currents flowing through the two terminals are measured. The current flowing through each capacitor terminal is measured by measuring the voltage drops across two resistors which are each coupled to one of the terminals. The terminal which exhibits the larger current flow and/or a lagging current characteristic compared to the other terminal is thus determined to be the cathode terminal (negative terminal) of the electrolytic capacitor.

7 Claims, 2 Drawing Sheets

POLARITY TESTING PROCESS AND DEVICE FOR ELECTROLYTIC CAPACITORS

FIELD OF THE INVENTION

The present invention relates to a method and a device for testing the polarity of wet aluminum electrolytic capacitors having a metallic housing and at least two terminal connections of differing polarity.

BACKGROUND OF THE INVENTION

When the final electrical inspection test is made, it is often very difficult and sometimes even impossible to detect aluminum electrolytic capacitors that have been installed with reversed polarity. This can lead to field losses of electrolytic capacitors due to polarity reversal. To prevent this, optical and mechanical polarity indicators have already been used on electrolytic capacitors, in order to recognize polarity on the basis of the different terminal leads or merely to allow correct insertion into a printed circuit board. For this purpose, in known methods heretofore, one uses different terminal leads that are distinguished by differences in crimping, bending, thickness, color, or the like. However, these optical and mechanical polarity indicators require additional manufacturing steps on the electrolytic capacitor, which not only can adversely affect the reliability of operation, but can also result in increased costs. While optical polarity indicators are often unreliable, and can often hardly be detected after being soldered into a printed-circuit board, the mechanical polarity indicators still require costly additional measures on the printed-circuit boards, such as differently sized bore holes or differently shaped openings, which are complicated and expensive to introduce.

SUMMARY OF THE INVENTION

The advantage of the method and apparatus of the present invention is that the polarity of all electrolytic capacitors can be detected independently of their type of construction and of the nature of the connections, thus, for example, both for radial as well as axial electrolytic capacitors, it merely being necessary for these electrolytic capacitors to have a metal housing. Thus, the polarity of nearly all commercially available electrolytic capacitors can be detected in accordance with the invention. For this reason, there is no need for specially designed electrolytic capacitors, nor for any variations in layout on the printed-circuit boards; this leads to a reduction in costs and manufacturing steps. The test can be performed on the individual component, as well as on the finished circuit, i.e., a final inspection test can also be made. Resistors, capacitors, diodes, transistors, and ICs situated parallel to the electrolytic capacitor to be tested in the circuit do not adversely affect the result, provided that the impedance that is parallel to the electrolytic capacitor lies under 10 ohms (given a measuring frequency of f=50 Hz). Due to the fact that small measuring voltages can be used, other components connected to the electrolytic capacitor are not damaged or destroyed. A device for detecting polarity can be realized simply and cost-effectively, it being possible to have very short measuring times of about 60 ms.

The measuring resistors are expediently connected to testing lines, which are capable of being joined to the pole terminals of the capacitor and consist of a cathode line and of an anode line, a corresponding display signal being able to be generated by the display means when the testing lines are correctly connected. As a result, a quick and simple testing is rendered possible, the appropriate allocation to the pole terminals of the capacitor being able to be established through identification of the testing lines.

The measuring principle is advantageously based on the fact that the evaluation circuit of the present invention has means for comparing the amplitude and/or the phase relation of the voltages at the two measuring resistors, the measuring resistor connected to the cathode terminal (negative terminal) of the capacitor, given measuring resistances of the same magnitude, having a higher and/or lagging voltage compared to the anode voltage (or the voltage, that drops across an appropriately connected measuring resistor).

One advantageous refinement of the evaluation circuit of present invention in terms of a circuit arrangement consists in that it has means for generating a first square-wave voltage, which is derived from the measuring resistor connected to the cathode terminal or the anode terminal of the capacitor (depending on whether the capacitor has correct or reversed polarity), and has means for generating a second square-wave voltage, which is derived from the difference of the two voltages tapped off at the two measuring resistors; and that testing means are provided for testing the simultaneous occurrence of the second square-wave voltage and of the signal end range of the first square-wave voltage, the display signal being able to be generated by the testing means in dependence upon the testing result. The correct or incorrect polarity can be displayed quickly, reliably and automatically, since a clear polarity recognition is possible even when there are small differences in amplitude and phase relation.

To increase measuring reliability, the evaluation circuit has means for testing the existence of correct measuring signals, by means of which, given incorrect measuring signals, the display signals can be blocked and/or a warning signal can be generated. For example, if a test probe for supplying the measuring a.c. voltage to the housing of the capacitor is not correctly applied, then an error signal is produced, because the measuring signals fail to appear, which, for instance, invalidates an existing display signal indicating a correct polarity.

The testing a.c. voltage is obtained simply and cost-effectively from the system a.c. voltage, so that a testing frequency of 50 Hz is available. To ensure that other surrounding and peripheral components on a printed-circuit board are reliably protected, one expediently selects a value of less than 0.5 V, preferably a value in the millivolt range for the measuring voltage.

DETAILED DESCRIPTION

Figure 1:
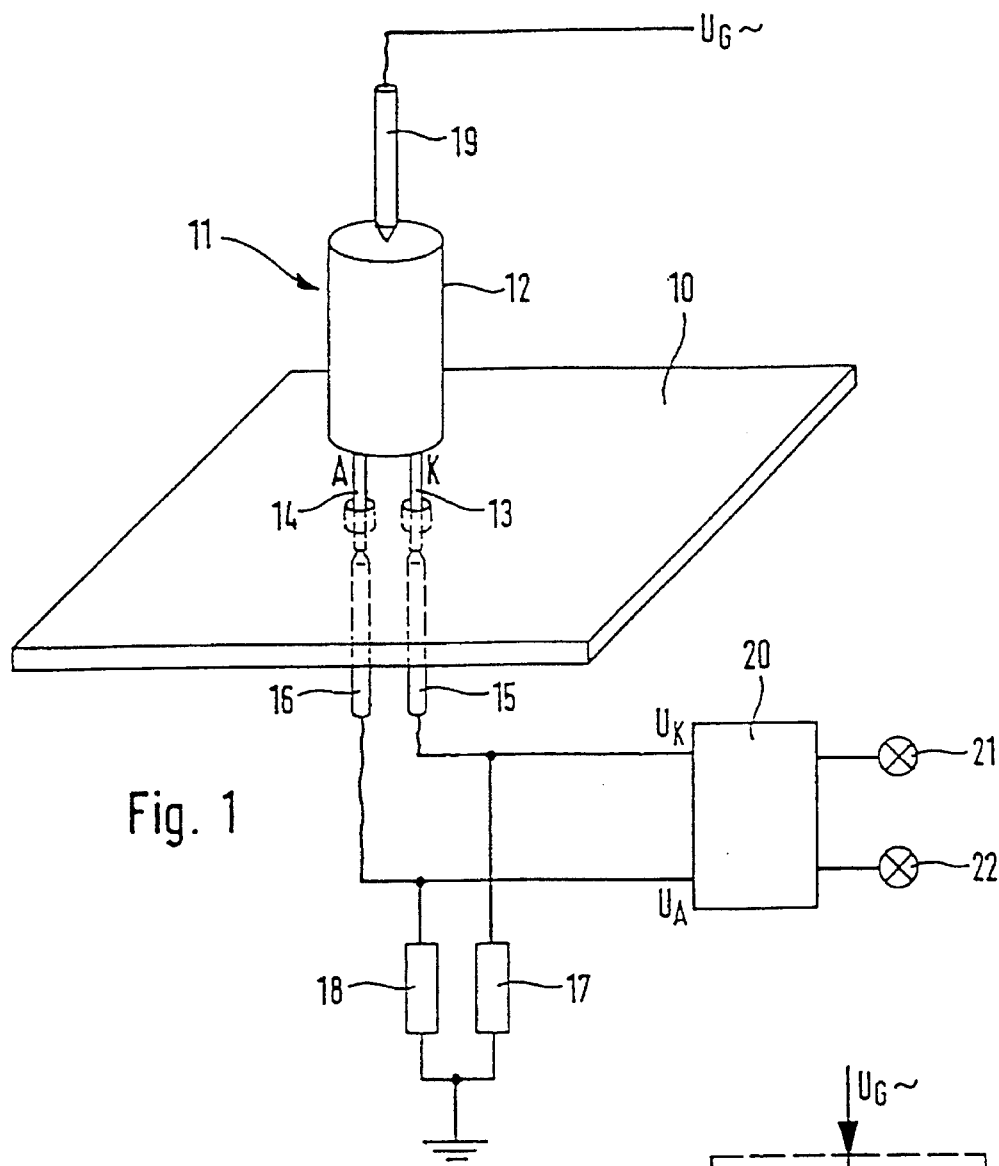
FIG. 1 is a schematic representation of a first embodiment of a device for testing the polarity of electrolytic capacitors, in accordance with the present invention.

In the case of the measuring arrangement shown in FIG. 1, a printed-circuit board 10 is shown, on which is placed an aluminum electrolytic capacitor 11, whose polarity is supposed to be determined, or rather tested. Other electronic components, which, together with the electrolytic capacitor 11, make up an electronic circuit, are not shown on the printed-circuit board 10 for purposes of simplification. To be able to implement the polarity recognition in accordance with the present invention, the electrolytic capacitor 11 must have a metal housing 12 that is cup-shaped in the depicted exemplified embodiment. Two pole terminals 13, 14 of the electrolytic capacitor 11 form its cathode K and anode A. By way of two test probes 15, 16, the pole terminals 13, 14 of the electrolytic capacitor 11 are connected to two measuring resistors 17, 18, which are connected in each case by their other terminal to ground. A testing a.c. voltage $U_G$, which has a frequency of 50 Hz and a voltage of 10 volts, is applied between the metal housing 12 of the electrolytic capacitor 11 and ground. Another test probe 19 is used for this purpose. The voltage drop $U_K$ or $U_A$ across the two measuring resistors 17 or 18 is fed to an evaluation circuit 20, which on the output side has two test lamps 21, 22. The voltage $U_K$ at the measuring resistor 17 is, of course, the cathode voltage, only when the electrolytic capacitor 11 is correctly poled. The same applies to the voltage $U_A$ at the measuring resistor 18, which is the anode voltage only when the electrolytic capacitor 11 is correctly poled. To check for correct polarity, the test probes 15, 16 are applied in the depicted manner to the pole terminals 13, 14, and the test probe 19 to the metal housing 12, so that given a correct polarity, the test lamp 21, designed, for example as a green test lamp, lights up. Given an incorrect polarity, as when the anode and the cathode of the electrolytic capacitor 11 are reversed, the lamp does not light up.

Furthermore, the existence of correct measuring signals is checked at the same time by the evaluation circuit 20, the second test lamp 22, designed, for example, as a red test lamp, lighting up when incorrect measuring signals are at hand. Such incorrect measuring signals can occur, for example, when there is a poor contacting by the test probes, in the case of loose connections or faulty testing a.c. voltage. If, on the other hand, the measuring signals are correct, then the testing lamp 22 is not switched on.

As a variation of the depicted measuring arrangement, the test probes 15, 16, 19 can be completely or partially replaced by test terminals. Furthermore, the test a.c. voltage source can be contained in the evaluation circuit 20, which, of course, also applies to the measuring resistors 17, 18. Thus, there is a compact evaluation device in a housing, out of which emanate merely three testing lines having three test probes or rather test terminals.

In place of test lamps, other acoustical or optical signals can be used, of course, to identify correct or incorrect polarity and the existence of correct or incorrect measuring signals. In place of two test lamps, it is also possible to use only one single lamp, which flashes, for example, when incorrect measuring signals are at hand.

Figure 2:
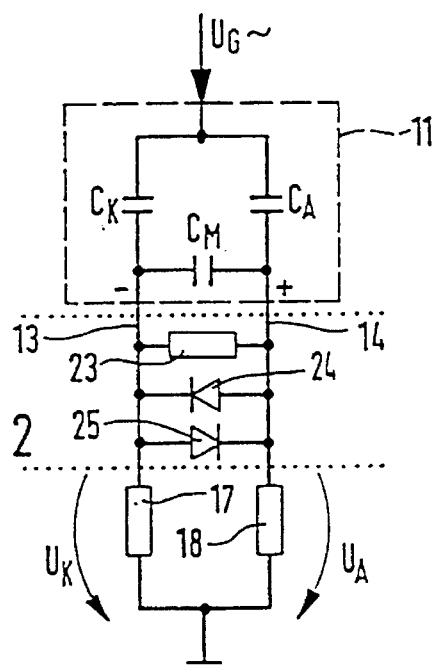
FIG. 2 is a schematic diagram of an equivalent circuit for an electrolytic capacitor coupled to a typical circuit and to two measuring resistors.

To clarify the mode of operation of the device depicted in FIG. 1, the equivalent circuit diagram of the electrolytic capacitor 11 shown in FIG. 2 will be clarified in detail. In addition to the capacitance $C_M$ of the electrolytic capacitor between the cathode and the anode, capacitances between the housing and the cathode, as well as between the housing and the anode are denoted by $C_A$, or rather $C_K$. For purposes of simplification, the equivalent resistances and inductances have been omitted. Furthermore, in this equivalent circuit, the resistance-inductance-capacitance (RLC) combination between the electrolyte and the housing has been dispensed with. The anode has a thick oxide layer, which was formed by the formatting process, while the cathode has a thin oxide layer (air oxidation). Therefore, $C_K \gg C_A$. Measurements taken at various electrolytic capacitors revealed that $C_K$ and $C_A$ are dependent upon the dimensions of the housing and, therefore, upon the nominal capacitance and the nominal voltage. In this case, $C_K$ is always greater than $C_A$.

To simulate a circuit having active and passive components, a resistor 23 having 10 ohms and two diodes 24, 25 are connected in anti-parallel between the pole terminals 13, 14, thus between the anode and cathode of the electrolytic capacitor 11.

As a result of the differing capacitances $C_K$ and $C_A$, the applied test a.c. voltage $U_G$ causes different currents to flow through the measuring resistors 17, 18, so that different measuring voltages $U_K$ and $U_A$ are able to be tapped off at these measuring resistors. These voltages differ both in phase as well as in amplitude. Depending on the structure of the electrolytic capacitor 11, either the amplitude difference or the phase shift predominates in evaluating these voltages. The following tendency can be established: the larger $C_A$ and $C_K$ are, thus the housing size, the larger the phase shift becomes, and the relative amplitude difference is diminished. In any case, however, the amplitude of $U_K$ is greater than that of $U_A$, and $U_K$ lags in comparison with $U_A$ in terms of phase relation. This factual situation is electrically evaluated in the evaluation circuit 20 and utilized to determine polarity.

Figure 3:
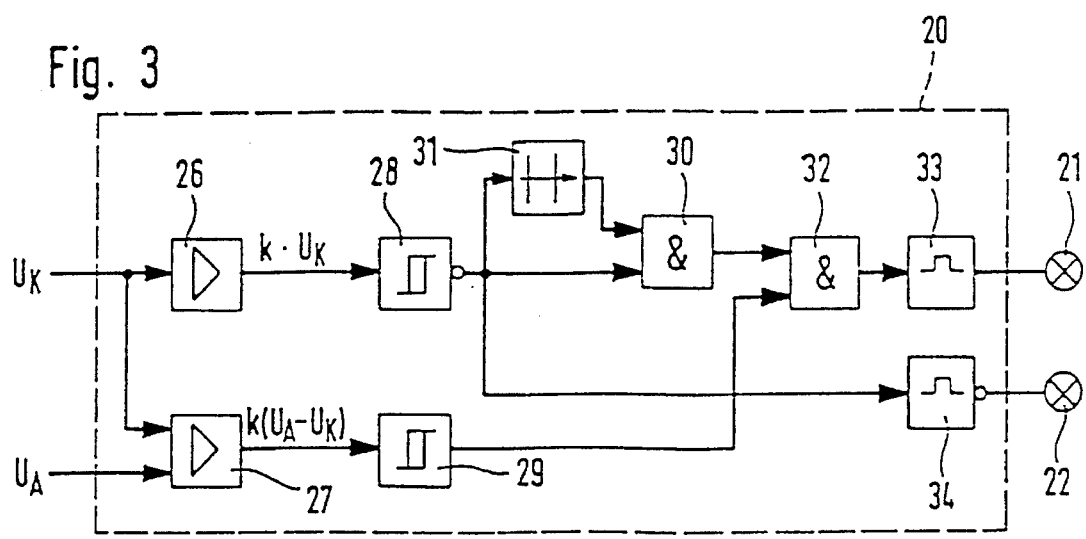
FIG. 3 is a block diagram of an electrolytic polarity testing circuit in accordance with the present invention.

FIG. 3 is an illustrative specific embodiment of the evaluation circuit 20 shown in FIG. 1 as a block diagram. The voltages entered there apply for the correctly poled electrolytic capacitor 11. The voltage $U_K$ tapped off at the measuring resistor 17 is thereby supplied to a first amplifier 26 having the amplification factor k. Furthermore, both measuring voltages $U_K$ and $U_A$ are supplied to a second amplifier 27 designed as a differential amplifier, which likewise has the amplification factor k. The outputs of the amplifiers 26, 27 are connected to inputs of signal-conditioner stages 28, 29, respectively, by means of which the sinusoidal input voltages are converted into square-wave voltages. The signal-conditioner stages can be Schmitt triggers, for example. In this case, the signal-conditioner stage 28 has an inverting output, which is connected to an input of an AND-gate 30 and via a time-delay element 31 to the second input of the AND-gate 30. The output of the AND-gate 30 is connected to an input of a second AND-gate 32, whose second input is supplied with output signals from the signal-conditioner stage 29. The AND-gate 30 controls the test lamp 21 by way of a retriggerable timing element 33, while the inverting output of the signal-conditioner stage 28 controls the test lamp 22 by way of another retriggerable timing element 34 having an inverting output.

Figure 4:
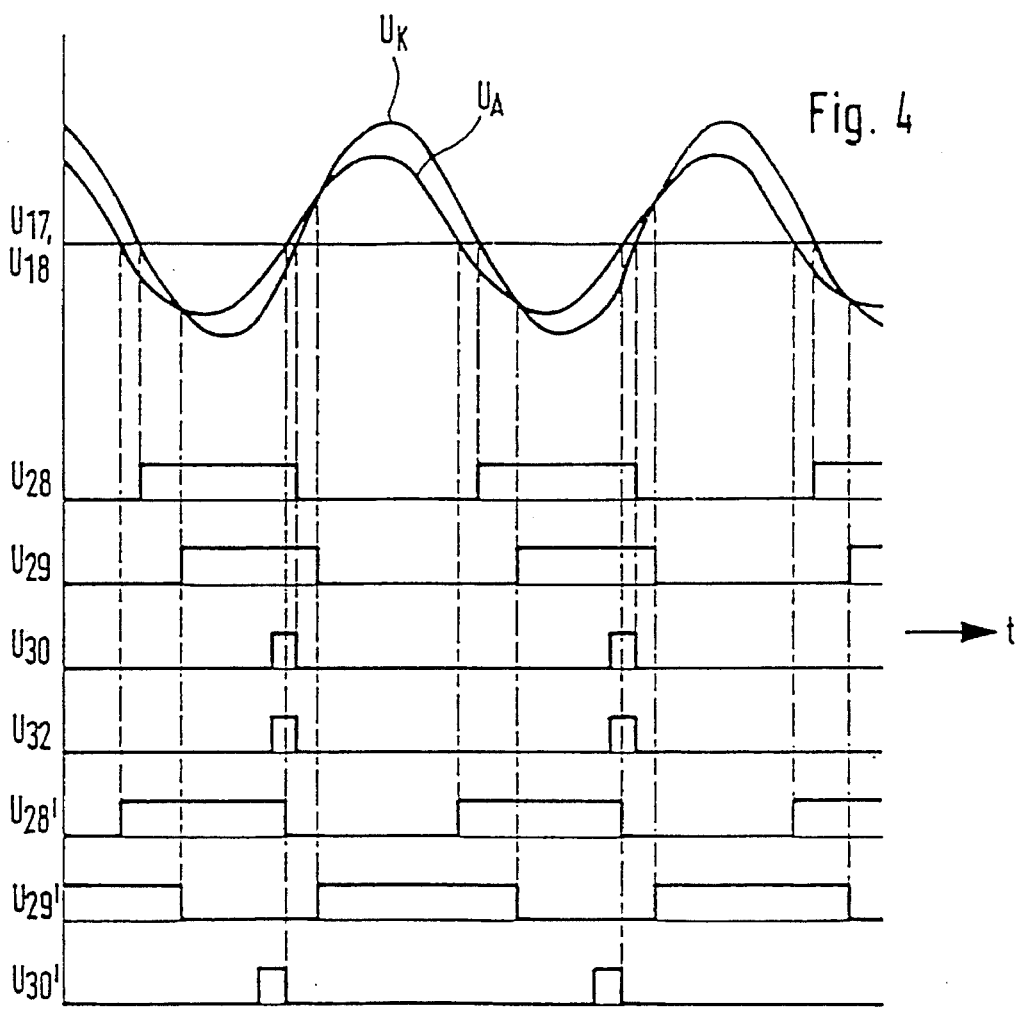
FIG. 4 is a timing diagram depicting various signals in the circuit of FIG. 3.

The mode of operation of the evaluation circuit 20 shown in FIG. 3 will be clarified in the following on the basis of the signal diagram depicted in FIG. 4. For allocation purposes, the various signals are provided with numerals denoting that component, whose output signals they represent.

First, one starts out from the assumption that the test probes 15, 16 are correctly applied to the cathode and anode of the electrolytic capacitor 11. The signal k ($U_A - U_K$), thus the differential signal between the two measuring voltages, is generated in the differential amplifier 27. The inverted output signal from the signal-conditioner stage 28 is delayed in the signal-delay stage 31 by a time lag, which nearly corresponds to the signal duration of the signal $U_{28}$. In this manner, the signal $U_{30}$, which corresponds to the signal end range of the signal $U_{28}$, is generated at the output of the AND-gate 30. Given correct polarity and as a result of the phase shift, this signal $U_{30}$ must appear during the signal duration of a signal $U_{29}$, which corresponds to the differential signal $U_A$–$U_K$. Therefore, given correct polarity, signals $U_{32}$, which correspond to the signals $U_{30}$, are produced at the output of the AND-gate 32. These signals $U_{32}$ trigger the retriggerable timing element 33, so that the test lamp 21 is lit and indicates a correct polarity.

The case of an incorrect polarity is depicted in the three lowest signal lines, i.e., the test probe 15 is connected to the anode, and the test probe 16 to the cathode of the electrolytic capacitor 11. Accordingly, the signal $U_{28}$ now results at the output of the signal-conditioner stage 28 from the measuring signal $U_A$. In a corresponding manner, the signal $U_{29}$ results from the differential signal $U_K$–$U_A$. In this case, the signal $U_{30}$ occurs, not simultaneously with a signal $U_{29}$, so that no signals occur at the output of the AND-gate 32. The retriggerable timing element 33 is not triggered, and the test lamp 21 does not light up.

To increase reliability, it is still tested by means of the retriggerable timing element 34 whether a measuring signal sequence is being applied at all. For example, given a poor contacting by one of the test probes 15, 16, 19, the measuring signals can also be dropped. In this case, the retriggerable timing element 34 is not triggered, so that as a result of the inverting output of the timing element 34, the test lamp 22 lights up and indicates faulty measuring signals.

Of course, other evaluation circuits, which are able to detect the correct or incorrect polarity of an electrolytic capacitor in dependence upon the amplitude and phase difference of the signals, can be used in place of the evaluation circuit 20. In the simplest case, for example, merely the amplitudes can be compared with one another, the signal $U_K$ showing a larger amplitude. For this purpose, for example, the two signals could be rectified, and the mean values compared with one another. In addition, known phase-comparison circuits can be used.

In place of the retriggerable timing element 34, more expensive circuit arrangements, which can also test signal distances, frequency, or the like, can be used to test correct measuring signals.

In the present description, one started out from the assumption that the measuring resistors 17, 18 have the same resistance values. In principle, of course, it is also possible for there to be different resistance values for special measured-value acquisitions, which different resistance values would be considered accordingly in the evaluation.

Besides generating a warning signal, the described device for testing the presence of correct measuring signals, in accordance with FIG. 3, the retriggerable timing element 34, can alternatively block the display of correct polarity, and thus in accordance with the exemplified embodiment, prevent the test lamp 21 from lighting up. As a result, only one single warning device or test lamp is needed. In place of a complete blocking, a flashing operation can be generated, which indicates incorrect measuring signals.

What is claimed is:

1. A method for testing the polarity of an electrolytic capacitor having a metallic housing and two terminals of different polarities, the method comprising the steps of:

applying an a.c. test voltage between the metallic housing and ground;

coupling each of the terminals of the capacitor to ground;

measuring currents flowing through each of the terminals of the capacitor; and generating a first signal if the current through the first of the terminals is larger than or lags the current through the second of the terminals, wherein the first signal indicates a correct polarity when the first terminal is a cathode and the second terminal is an anode.

2. The method according to claim 1, wherein the step of measuring the currents flowing through the terminals includes measuring voltage drops caused by the currents through resistors connected in series with each of the terminals and coupling each of the terminals to ground.

3. A device for testing the polarity of an electrolytic capacitor having a metallic housing and two terminals of different polarities, the device comprising:

measuring resistors for connection to the terminals of the capacitor;

an a.c. test voltage source with a first voltage terminal for connection to the metallic housing and a second voltage terminal connected in series with each of the measuring resistors; and an evaluation circuit, for connection to the capacitor terminals, including a comparison sub-circuit for comparing voltage drops across each of the measuring resistors, and a polarity indication sub-circuit for generating a polarity indication in accordance with the comparison.

4. The device according to claim 3, wherein the measuring resistors are connected to testing lines for connection to the terminals of the capacitor, the testing lines including a cathode line and an anode line, with the polarity indication indicating a correct polarity if the voltage drop measured at the cathode line is larger than or lags the voltage measured at the anode line.

5. The device according to claim 3, wherein the comparison sub-circuit compares amplitudes of the voltage drops across each of the measuring resistors, the amplitude of the voltage across the measuring resistor connected to the cathode terminal having a larger amplitude than the voltage across the other measuring resistor, given measuring resistors of the same resistance.

6. The device according to claim 3, wherein the comparison sub-circuit compares phases of the voltage drops across each of the measuring resistors, the phase of the voltage across the measuring resistor connected to the cathode terminal lagging the phase of the voltage across the other measuring resistor.

7. The device according to claim 4, wherein the comparison sub-circuit includes:

an amplifier with an input coupled to the cathode line and generating a first square-wave voltage from the voltage drop measured at the cathode line, a differential amplifier with a first input coupled to the cathode line and a second input coupled to the anode line and generating a second square-wave voltage from the difference between the voltages measured at the anode and cathode lines, and logic for testing a simultaneous occurrence of the second square-wave voltage and of a signal end range of the first square-wave voltage; and wherein the polarity indication sub-circuit generates a correct polarity indication if there is a simultaneous occurrence of the second square-wave voltage and of the signal end range of the first square-wave voltage.

* * * * *